United States Patent [19]
Mabuchi et al.

[11] Patent Number: 5,951,887
[45] Date of Patent: Sep. 14, 1999

[54] PLASMA PROCESSING APPARATUS AND PLASMA PROCESSING METHOD

[75] Inventors: Hiroshi Mabuchi, Amagasaki; Toshihiro Hayami, Nishinomiya; Hideo Ida, Oume; Tomomi Murakami, Amagasaki; Naohiko Takeda; Junya Tsuyuguchi, both of Nishinomiya; Katsuo Katayama, Amagasaki, all of Japan

[73] Assignee: Sumitomo Metal Industries, Ltd., Osaka, Japan

[21] Appl. No.: 08/952,782

[22] PCT Filed: Mar. 27, 1997

[86] PCT No.: PCT/JP97/01070

§ 371 Date: Nov. 26, 1997

§ 102(e) Date: Nov. 26, 1997

[87] PCT Pub. No.: WO97/36461

PCT Pub. Date: Oct. 2, 1997

[30] Foreign Application Priority Data

Mar. 28, 1996 [JP] Japan ................... 8-073467
Jan. 31, 1997 [JP] Japan ................... 9-018912

[51] Int. Cl.$^6$ .................................................. B23K 10/00
[52] U.S. Cl. ................... 219/121.43; 219/121.44; 219/121.4; 204/298.38; 156/34 T; 118/723 MW
[58] Field of Search ................. 219/121.43, 121.4, 219/121.44, 121.48, 740; 204/298.37, 298.17, 298.38; 156/345, 643.1, 646.1; 118/723 MW

[56] References Cited

U.S. PATENT DOCUMENTS 4,358,744 11/1982 Tikes ........................................... 333/33
5,038,712 8/1991 Fujiyama .................................. 118/723
5,279,669 1/1994 Lee ..................................... 118/723 MR
5,290,993 3/1994 Kaji et al. ........................... 219/121.43
5,545,258 8/1996 Katayama et al. .................. 219/121.43

FOREIGN PATENT DOCUMENTS 61-241930 10/1986 Japan .
2-67632 5/1990 Japan .
4-117437 10/1992 Japan .
6-104098 4/1994 Japan .
6-112138 4/1994 Japan .
7-86246 3/1995 Japan .
7-335567 12/1995 Japan .

*Primary Examiner*—Mark Paschall
*Attorney, Agent, or Firm*—Armstrong, Westerman, Hattori, McLeland & Naughton

[57] ABSTRACT

A plasma processing apparatus and plasma processing method are provided to be used for etching, ashing, CVD, etc. in the manufacturing, etc. of large-scale integrated circuits (LSIs) and liquid crystal display panels (LCDs). The plasma processing apparatus generates plasma by using a microwave introduced through a microwave window, while controlling the ions in the plasma by varying the RF voltage applied to the sample stage. The apparatus is characterized to include a counter electrode (grounded electrode) which is located at the rim section of the microwave window against the sample stage. The plasma processing method implements a plasma process for a sample with the plasma processing apparatus. The method and apparatus are capable of alleviating the sticking of particles to the sample and metallic contamination, and also capable of improving the yield of semiconductor devices, etc.

12 Claims, 10 Drawing Sheets

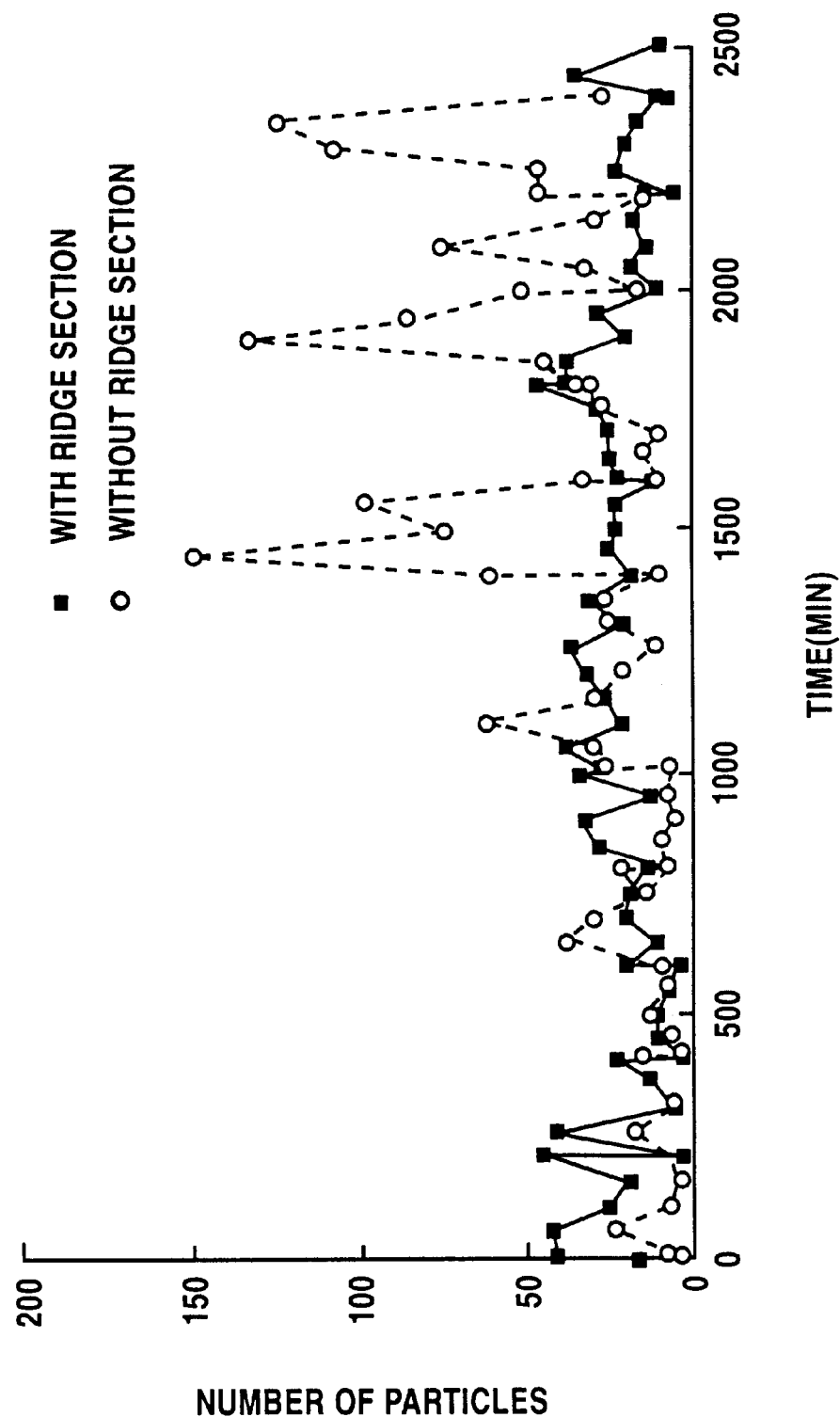

PLASMA PROCESSING APPARATUS AND PLASMA PROCESSING METHOD

TECHNICAL FIELD OF THE INVENTION

The present invention relates to a plasma processing apparatus and plasma processing method used for etching, ashing, chemical vapor deposition (CVD), etc. in the manufacturing, etc. of large-scale integrated circuits (LSIs) and liquid crystal display panels (LCDs).

BACKGROUND OF THE INVENTION

Processes based on plasma of reactive gases are adopted widely in the manufacturing of LSIs, LCDs, etc. Particularly, the dry etching technique using plasma is an indispensable fundamental technique for the manufacturing processes of LSIs, LCDs, etc.

On the other hand, as the size of substrates used for the fabrication of LSIs, LCDs, etc. increases, it is required to generate plasma uniformly over a wide area. It is also required for the dry etching technique and the embedding technique for thin film formation to control plasma generation and ion energy in the plasma independently.

The present applicant has disclosed in Japanese patent publication JP-A-Hei-6-104098 a plasma processing apparatus which is capable of generating plasma uniformly over a wide area and controlling the ion energy.

FIG. 1 is a brief vertical cross-sectional view of this plasma processing apparatus.

In the apparatus, a reaction room 12 has a microwave window 14 at the top, and a dielectric plate 32 for propagating the microwave is laid over the microwave window 14. A Radio frequency (RF) power source 28 is connected to a sample stage 15, which confronts a counter electrode 41 which is attached on the lower surface of the microwave window 14 by being grounded electrically.

FIG. 2 is a top view of an example of the counter electrode 41.

The counter electrode 41, which is made of metal such as aluminum, has microwave introduction holes 41a for introducing the microwave into the reaction room 12.

In the apparatus, the microwave is propagated flatly in the dielectric plate 32. Accordingly, it is possible for the apparatus to generate uniform plasma in a wide area by having a large dielectric plate 32 and a large microwave window 14.

Based on the disposition of the counter electrode 41 on the lower surface of the microwave window 14, it is possible for the apparatus, in the case of applying an RF voltage to the sample stage 15, to stabilize the electrical circuit including the sample stage, plasma and counter electrode, and generate a stable bias voltage on the surface of a sample S. Consequently, it is possible to control stably the acceleration of ion (ion energy) in the plasma by varying the bias voltage.

The apparatus is designed to generate plasma mainly by using the microwave and control the ion energy mainly by using the RF voltage applied to the sample stage. Accordingly, it is possible to control plasma generation and ion energy independently.

However, the apparatus of the above-mentioned structure has its counter electrode located immediately above the sample. Because of this, the deposit is created in plasma and sticks to the counter electrode and the counter electrode itself is liable to be sputtered by the plasma and stick to the sample S. As a result, the apparatus is liable to suffer from the sticking of particles to the sample and also from metallic contamination.

The present invention is intended to resolve the foregoing problems, and its object is to provide a plasma processing apparatus and plasma processing method capable of reducing the sticking of particles to the sample and metallic contamination.

SUMMARY OF THE INVENTION

The plasma processing apparatus of the present invention includes means for supplying a microwave, a reaction chamber having a microwave window and a sample stage which confronts the microwave window, means for applying a radio frequency (RF) voltage to the sample stage, and a counter electrode which is located to confront the sample stage and which is grounded electrically, wherein the counter electrode is located in the rim section of the microwave window inside the reaction chamber.

The apparatus of the present invention has its sufficiently large counter electrode located in the rim section of the microwave window, while avoiding the position immediately above the sample. Immediately above the sample, there is no metal that can be a source of particles or contamination. Therefore, it becomes possible to perform a plasma process with a stable bias voltage, while suppressing the sticking of particles to the sample and metallic contamination.

BRIEF DESCRIPTION OF THE DRAWING FIGURES

FIG. 19 is a graph showing the variation of the number of particles along the plasma discharge time.

DETAILED DESCRIPTION OF THE INVENTION

Figure 1:
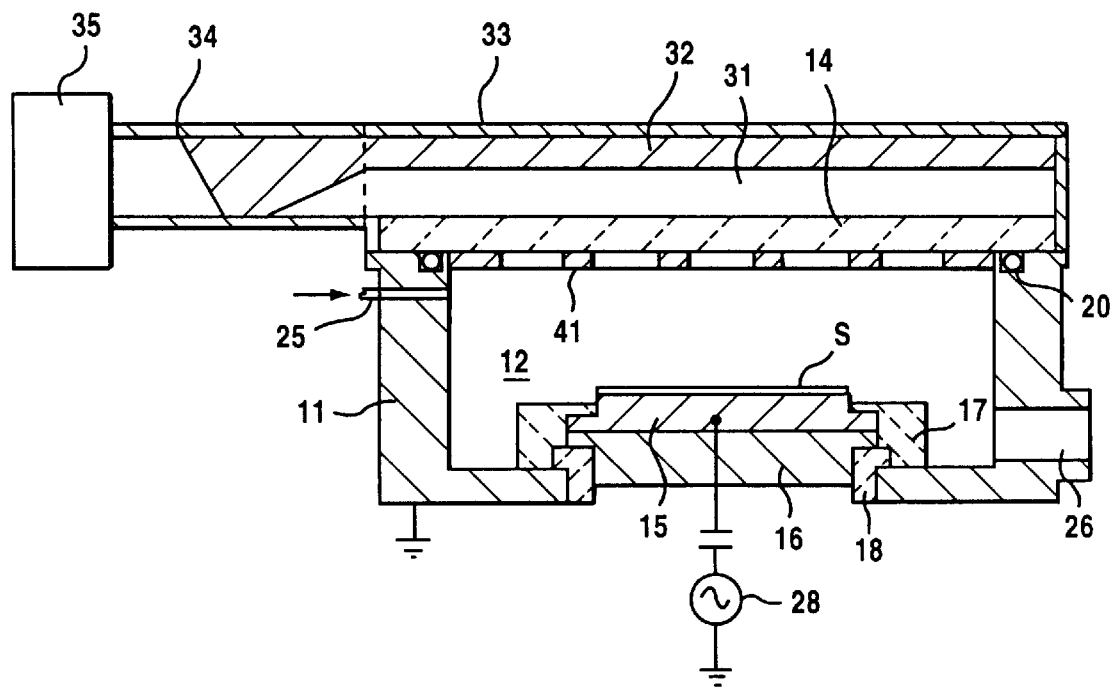
FIG. 1 is a vertical cross-sectional view of the conventional plasma processing apparatus.
Figure 2:
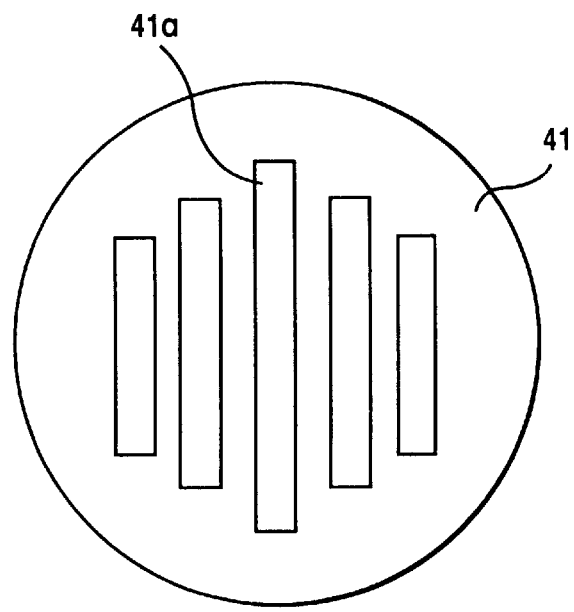
FIG. 2 is a plan view of the counter electrode of the conventional plasma processing apparatus.

The rim section of the microwave window mentioned above signifies the outer portion of the microwave window around the central section immediately above the sample.

The bias voltage produced on the sample surface by the application of an RF voltage to the sample stage is generated through the electrical circuit including the sample stage, plasma and reaction chamber and therefore, the magnitude of the bias voltage is greatly affected by the plasma potential. The plasma potential varies greatly depending on the contact state between the electrically-grounded metal (which serves as the counter electrode) and the plasma Accordingly, in order for the apparatus, which is designed to generate high-density plasma beneath the microwave window, to control ion energy stably, the counter electrode must be located close to the position of plasma generation, i.e., close to the position under the microwave window.

Depending on the position of the counter electrode, the deposit, which is created in the plasma and which sticks to the counter electrode, and the counter electrode, itself, are both sputtered by the high-density plasma, resulting in the problems of sticking of particles to the sample and metallic contamination.

In dealing with this matter, the present inventors tried etching samples by varying the shape of the counter electrode which is located close to the position under the microwave window in pursuit of counter electrodes which alleviate the creation of particles and metallic contamination.

The trial revealed: (a) the provision of an electrode that takes up only the rim section of microwave window which does not directly confront the sample stage, i.e., which is not immediately above the sample, can reduce the creation of particles and metallic contamination; (b) the electrode of only the rim section of the microwave window can be large enough to produce a stable bias voltage, provided that the reaction room is sufficiently large.

Namely, the apparatus of the present invention has a sufficiently large counter electrode located in the rim section of the microwave window, while avoiding the position immediately above the sample. Immediately above the sample, there is no metal that can be a source of particles or contamination. Therefore, it becomes possible to perform a plasma process with a stable bias voltage, while suppressing the sticking of particles to the sample and the metallic contamination.

This counter electrode also advantageously raises the plasma density by limiting the microwave passage into the reaction room and thus, confining the plasma generation region. Increasing the plasma density not only raises the processing rate of the sample, but enhances the quality of etching of fine patterns.

Five embodiments of the plasma processing apparatus and plasma processing method based on the present invention and the results of experiments conducted with the plasma processing apparatus and plasma processing method of the present invention will be explained specifically.

First Embodiment

Figure 3:
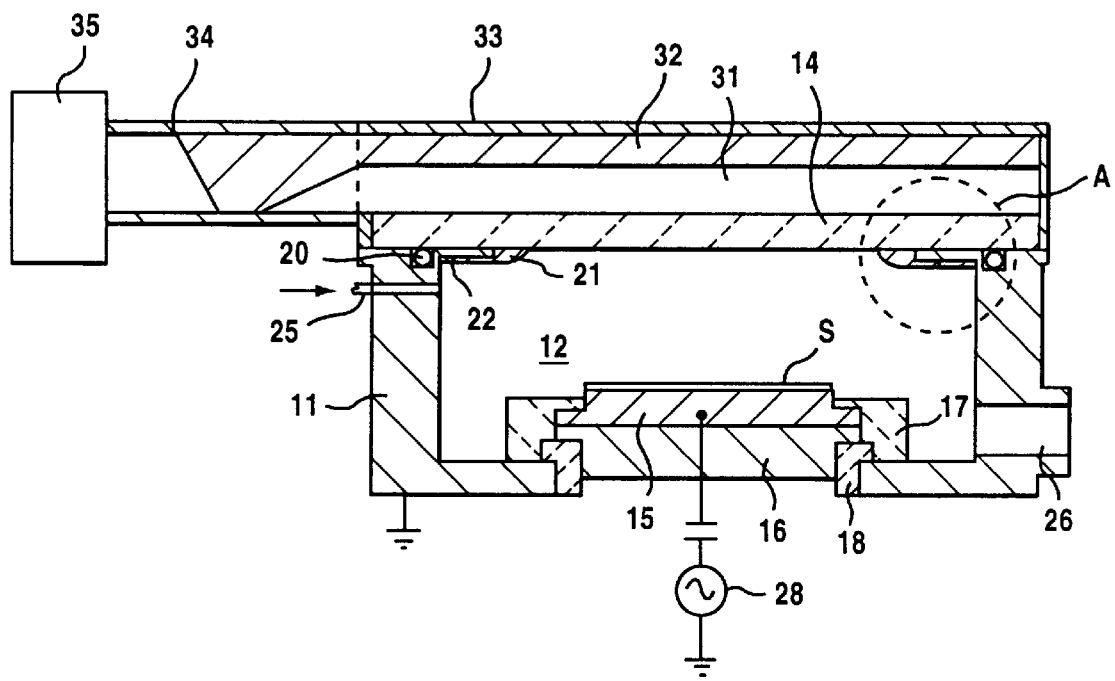
FIG. 3 is a vertical cross-sectional view of a first embodiment of the plasma processing apparatus of the present invention.

FIG. 3 shows in a vertical cross-section of the first embodiment of the plasma processing apparatus of the present invention.

The apparatus has a cuboidal hollow reaction chamber 11 which is generally made of metal such as aluminum or stainless steel. The reaction chamber 11 has a cylindrical reaction room 12 therein.

The top of the reaction chamber 11 is covered with a microwave window 14 so that the microwave window 14 airtightly seals the reaction room 12 by mean of an O-ring 20. The microwave window 14 is made of a dielectric substance, such as quartz glass ($SiO_2$) or alumina, having a high thermal durability, high microwave transmissivity, and small dielectric loss.

A sample stage 15 is disposed in the reaction room 12 at a position confronting the microwave window 14 and a sample S is placed on the sample stage 15. The sample stage 15 is connected to an RF voltage source 28 which is tuned to 400 kHz, 2 MHz, 13.56 MHz, etc.

The sample stage 15 has a chuck mechanism such as an electrostatic chuck (not shown) for holding the sample S and has a fluid circulating mechanism (not shown) for circulating a thermal medium for maintaining the sample S at a constant temperature. The sample stage 15 is fixed to a base 16, for example, while being insulated from the reaction chamber 11 by an insulating member 18. The sample stage 15 is surrounded by a plasma shielding member 17.

In case the sample stage 15 is designed to have a function of an electrostatic chuck, it has its an aluminum electrode surface coated with alumina by implantation or similar. The insulating member 18 and plasma shielding member 17 are made of alumina or similar.

The reaction chamber 11 has a gas inlet hole 25 for feeding gas into the reaction room 12 and an evacuation port 26 which communicates with an evacuation device (not shown). The reaction chamber 11 may have a side wall equipped with a heater, etc. so that the reaction chamber 11 is heated to a prescribed temperature.

A dielectric plate 32 is disposed over the reaction chamber 11 to confront the microwave window 14 and the top of the microwave window 14 is covered with a metallic sheet 33. The dielectric plate 32 is connected to a microwave generator 35 through a waveguide 34. The dielectric plate 32 is made of a suitable material having a small dielectric loss, e.g., fluororesin such as Teflon (registered trademark of Dupont), polyethylene, or polystyrene. The microwave frequency adopted in the first embodiment is, for example, 2.545 GHz.

In addition to above-described arrangement the apparatus of the first embodiment is provided with an annular counter electrode 21 in the rim section of the microwave window 14 so that a bias voltage is produced stably on the surface of the sample S. The counter electrode 21 is grounded electrically through the reaction chamber 11, and the counter electrode 21 serves as the grounded electrode against the sample stage 15 to which the RF voltage is applied.

Figure 4:
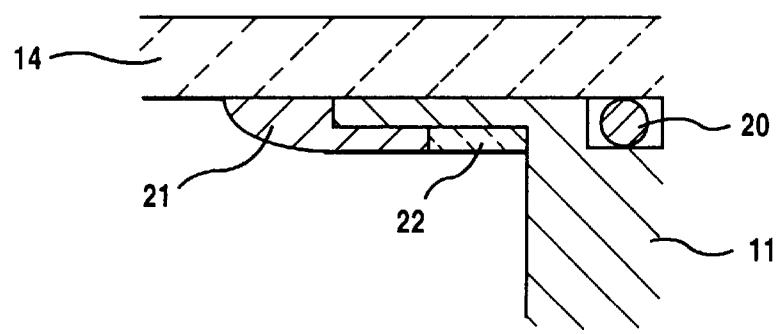
FIG. 4 is a detailed view of portion A of FIG. 3.

FIG. 4 shows the details of portion A of the apparatus of FIG. 3. The counter electrode 21 is separated from the side wall of reaction chamber 11 by the positioning of an electrode rim insulating plate 22 of alumina or similar which is fitted on the edge of the electrode 21.

Figure 5:
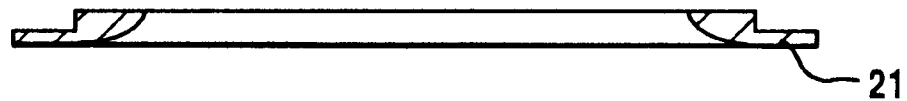
FIG. 5 is a vertical cross-sectional view of the annular electrode as an example of the counter electrode.
Figure 6:
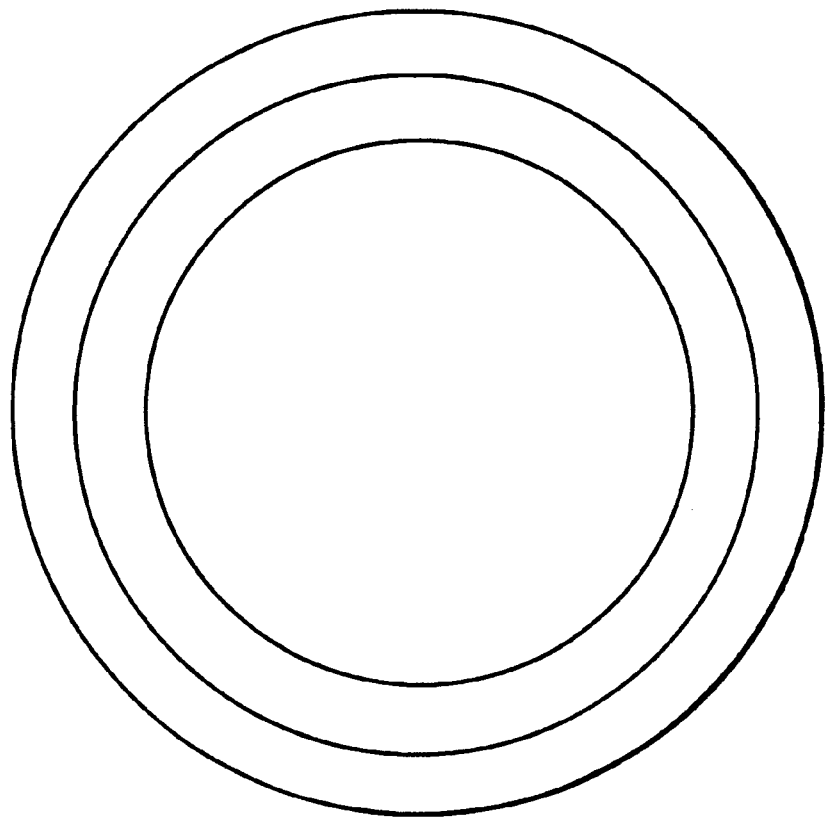
FIG. 6 is a bottom view of the annular electrode.

FIG. 5 and FIG. 6 are a vertical cross-sectional view and bottom view, respectively of an annular electrode as an example of the counter electrode 21.

The counter electrode 21 is made of silicon (Si), aluminum (Al), etc. In the case of an aluminum counter electrode 21, the electrode surface is preferably rendered by, for example, the "alumite" process or alumina coating process.

For the uniform plasma processing of a sample, the counter electrode 21 is preferably shaped symmetrically with respect to the sample S. More preferably, it has an annular shape from the viewpoint of structural design of the apparatus, although this is not compulsory.

The method of plasma processing with the above-described apparatus for a sample S will be explained with reference to FIG. 3 by taking an example of the etching process for the surface of the sample S.

① The reaction room 12 is evacuated of air through the evacuation port 26 and thereafter, gas is fed into the reaction room 12 through the gas inlet hole 25.

② The microwave generator 35 is activated to supply the microwave to the dielectric plate 32 through the waveguide 34. An electric field of surface wave is created in the hollow 31, and the electric field exerted across the microwave window 14 generates plasma in the reaction room 12.

③ Virtually simultaneously to plasma generation, the RF voltage source 28 is activated to apply an RF voltage to the sample stage 15, thereby producing a bias voltage on the surface of the sample S. The sample S is exposed to plasma, while ion energy of plasma is controlled by the adjustment of bias voltage, thereby etching the surface of the sample S.

Based on the provision of the counter electrode 21, which is shaped to exclude the portion immediately above the sample S, the sticking of particles to the sample S and metallic contamination can be reduced, and in addition the sample S can be etched based on a stabilized bias voltage produced on the surface of the sample S.

The counter electrode also advantageously raises the plasma density by limiting the microwave passage into the reaction room and thus, confining the plasma generation region. Increasing the plasma density not only raises the sample processing rate, but enhances the quality of etching of fine patterns.

Consequently, the plasma processing apparatus when used for the manufacturing of semiconductor devices is capable of improving the yield thereof.

Second Embodiment

Figure 7:
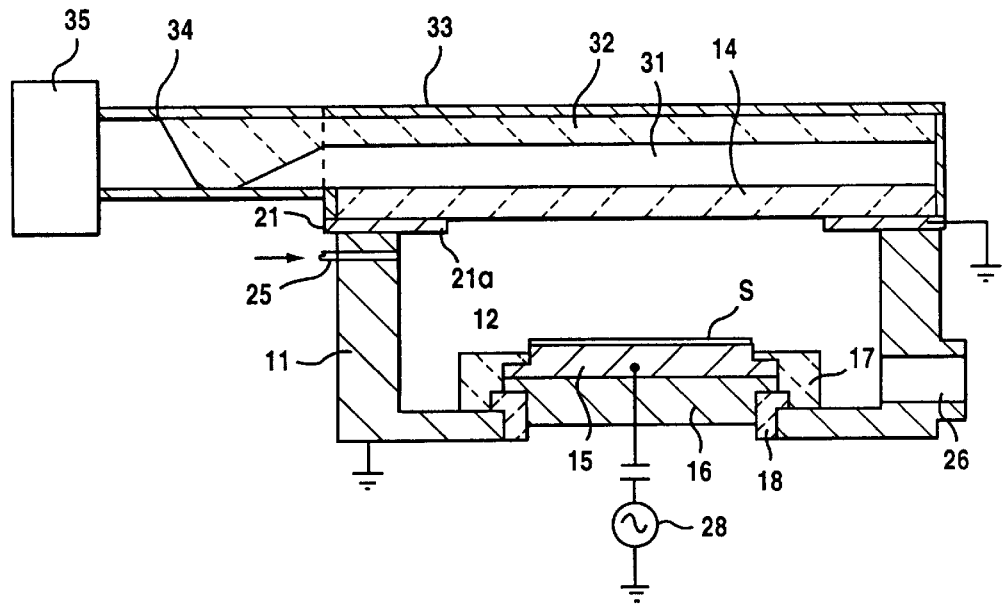
FIG. 7 is a vertical cross-sectional view of a second embodiment of the plasma processing apparatus of the present invention.
Figure 8:
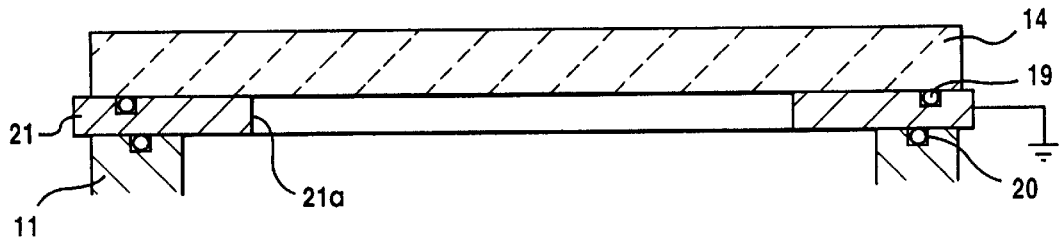
FIG. 8 is a detailed view of the microwave window and counter electrode of the apparatus of FIG. 7.

FIG. 7 shows in a vertical cross-section of the second embodiment of the plasma processing apparatus of the present invention, and FIG. 8 shows the details of the microwave window and counter electrode of the apparatus.

The plasma processing apparatus differs from the apparatus shown in FIG. 3 only in the counter electrode 21. Specifically, the counter electrode 21 is structured to include part of the wall of the reaction chamber 11 of the apparatus shown in FIG. 3.

Figure 9:
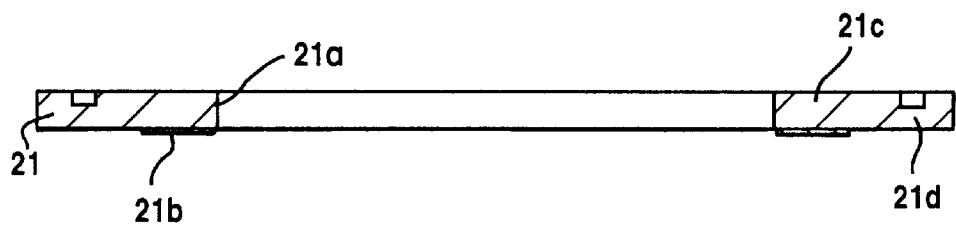
FIG. 9 is a vertical cross-sectional view of an example of the counter electrode.
Figure 10:
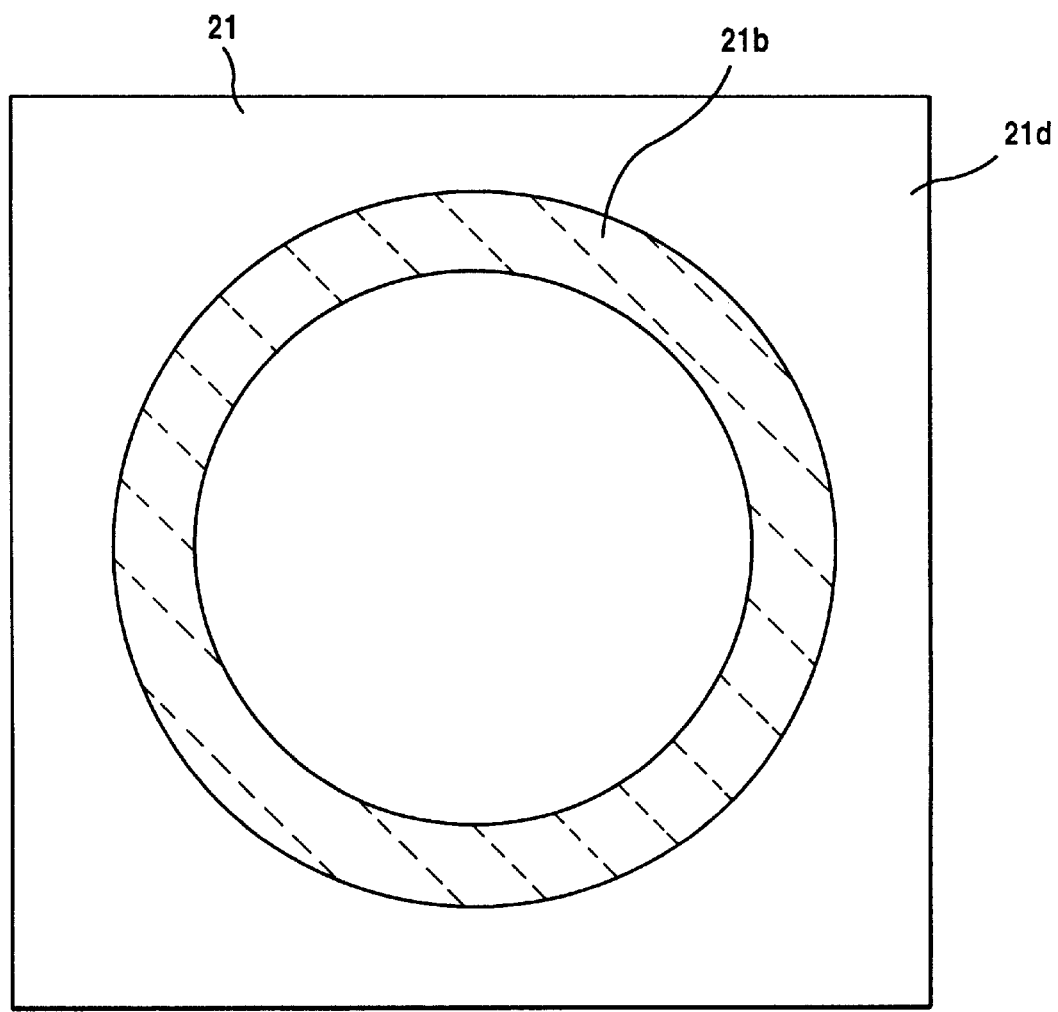
FIG. 10 is a bottom view of the electrode of FIG. 9.

FIG. 9 and FIG. 10 are a vertical cross-sectional view and bottom view, respectively of the counter electrode.

The counter electrode 21 consists of a portion 21c, which functions as counter electrode against the reaction chamber 12, and of a portion 21d, which forms part of the wall of the reaction chamber 11. The counter electrode 21 is made of aluminum or similar, with an edge section 21a and a surface 21b that are exposed to plasma preferably being rendered by the "alurite" process or alumina coating process.

The apparatus of this structure in which the counter electrode 21 and reaction chamber 11 are integrated, can reduce the creation of particles at the electrode fitting section. The counter electrode 21 is simpler in structure and therefore easier for manufacturing as compared with the counter electrode 21 of the first embodiment.

Third Embodiment

Figure 11:
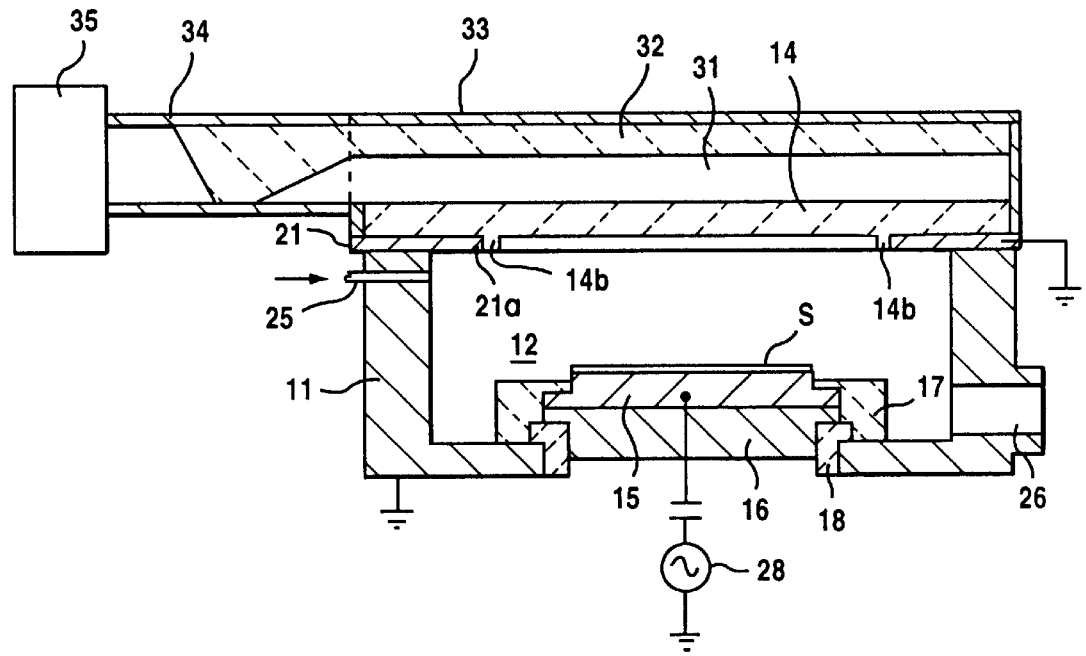
FIG. 11 is a vertical cross-sectional view of a third embodiment of the plasma processing apparatus of the present invention.

FIG. 11 shows a vertical cross-section of the third embodiment of the plasma processing apparatus of the present invention.

The edge section 21a of the counter electrode is liable to be sputtered by the high-density plasma generated immediately below the microwave window 14.

In the third embodiment, an annular ridge section 14b is formed on the microwave window 14 to protect the edge section 21a of the counter electrode against sputtering.

The structure of the third embodiment of the apparatus can suppress the increase with time of the sticking of particles to the sample S and metallic contamination.

Fourth Embodiment

Figure 12:
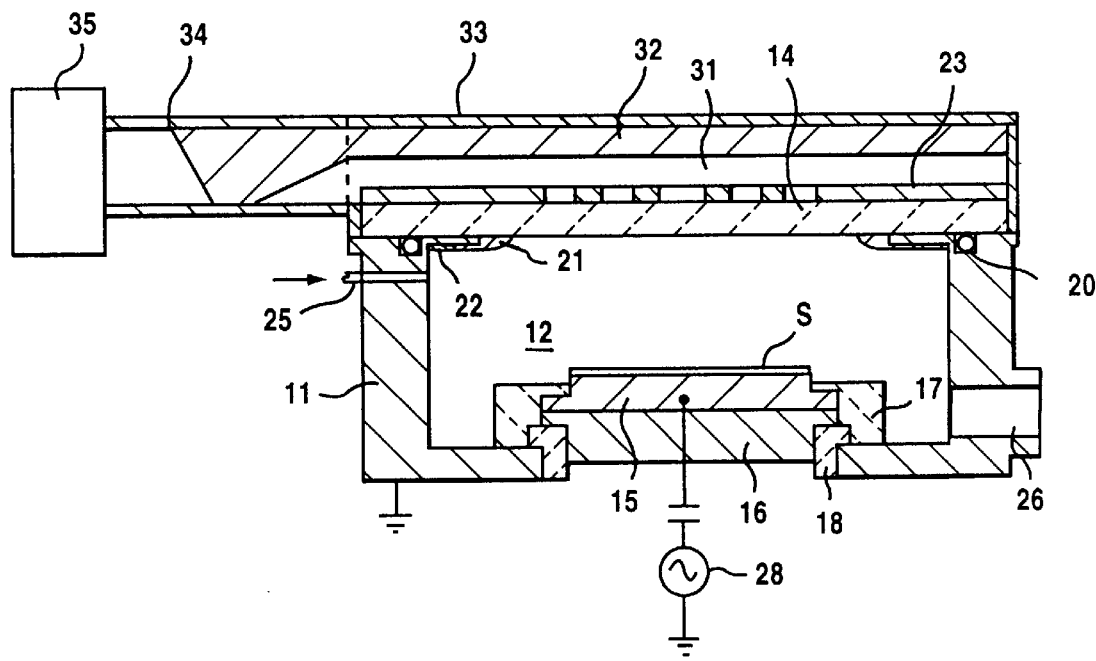
FIG. 12 is a vertical cross-sectional view of a fourth embodiment of the plasma processing apparatus of the present invention.

FIG. 12 shows a vertical cross-section of the fourth embodiment of the plasma processing apparatus of the present invention.

The plasma processing apparatus, which is derived from the apparatus shown in FIG. 3, further includes a microwave regulation plate 23 lying on the microwave window 14.

Figure 13:
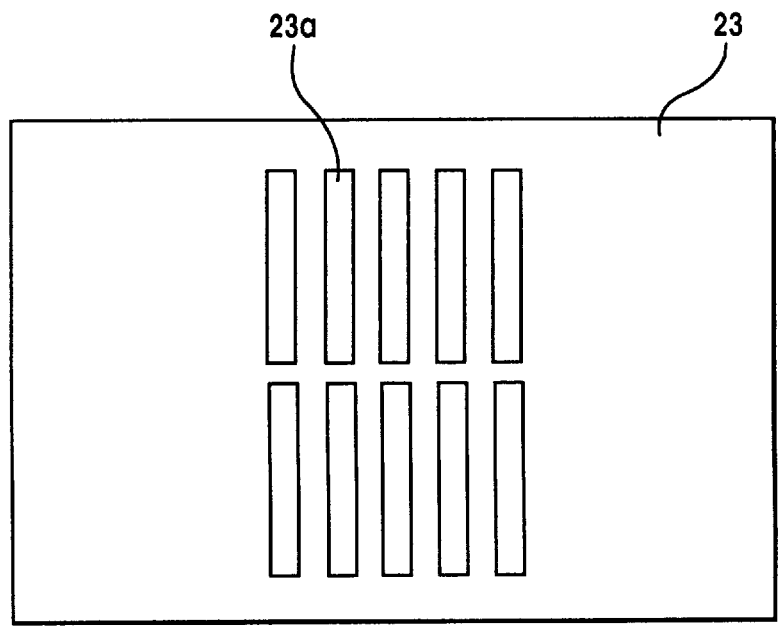
FIG. 13 is a plan view of an example of the microwave regulation plate.

FIG. 13 is a plan view of an example of the microwave regulation plate.

The microwave regulation plate 23, which is made of metal such as aluminum, has the formation of slits 23a at the central section which is above the sample S. The slits 23a, in a pattern configuration, regulates the electric field distribution of the microwave introduced into the reaction chamber 11, enabling the apparatus to perform more even plasma processing.

Figure 14:
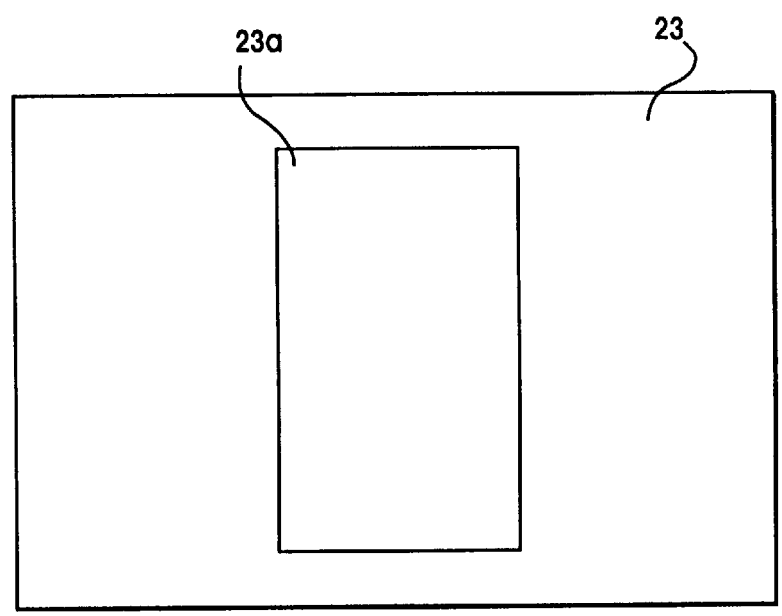
FIG. 14 is a plan view of another example of the microwave regulation plate.

FIG. 14 is a plan view of another example of the microwave regulation plate.

The microwave regulation plate 23 has only one opening 23a in the central section, and it is adopted for coping with the unevenness of plasma processing between the inner and outer portions of the sample S.

The microwave regulation plate 23 can also be used for confining the plasma generation region. Specifically, it is intended to confine the strong plasma generation to the region above the sample S and reduce plasma generation in the outer region so as to alleviate the sputtering on the edge section 21a of the counter electrode. Namely, the microwave regulation plate 23 can also be used to suppress the increase with time of the sticking of particles to the sample and the metallic contamination.

Fifth Embodiment

Figure 15:
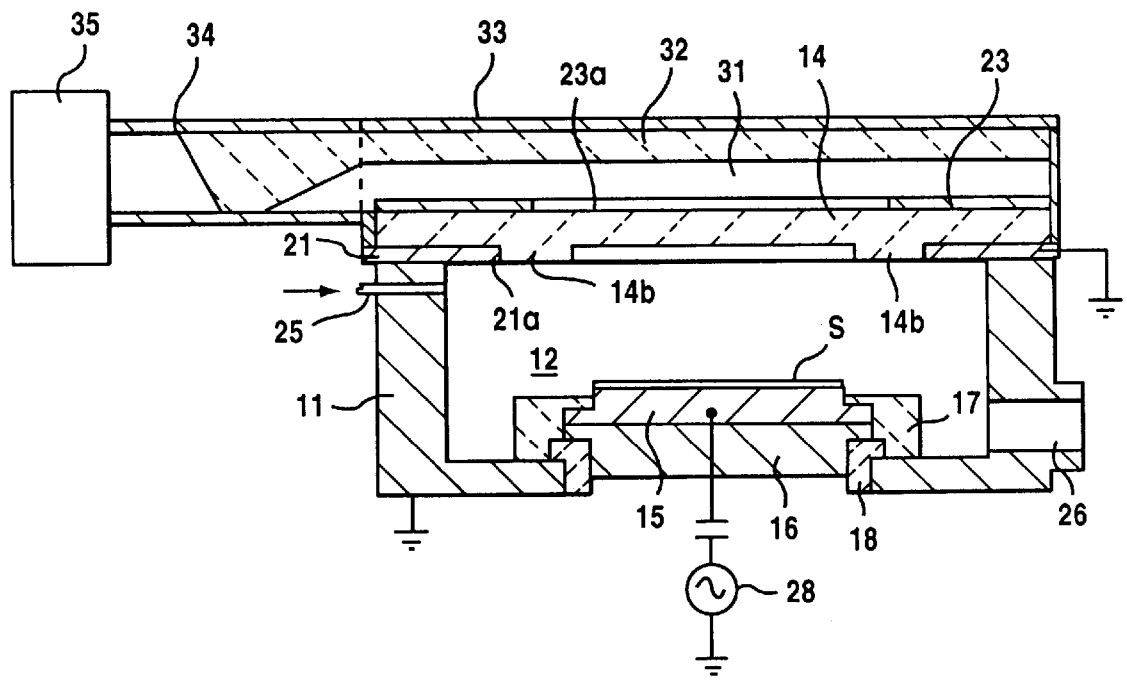
FIG. 15 is a vertical cross-sectional view of a fifth embodiment of the plasma processing apparatus of the present invention.

FIG. 15 shows a vertical cross-section of the fifth embodiment of the plasma processing apparatus of the present invention The plasma processing apparatus has the microwave window 14 of the apparatus shown in FIG. 11 and the microwave regulation plate 23 of the apparatus shown in FIG. 12.

Based on the above-described structure, the apparatus can protect the edge section 21a of the counter electrode 21 against sputtering and confine the plasma generation region.

Consequently, it is capable of suppressing the increase with time of the sticking of particles to the sample and metallic contamination, and in addition it is capable of etching a sample S based on a stabilized bias voltage produced on the sample surface.

By the combination of the counter electrode 21, microwave window 14, and microwave regulation plate 23 having a proper shape of opening, it becomes possible to adjust the introduction of the microwave into the reaction chamber 11 to thereby increase the plasma density.

Consequently, the plasma processing apparatus of the present invention, when used for the manufacturing of semiconductor devices, is readily capable of improving the yield thereof.

As explained above, for generating a stable bias voltage, it is necessary for the apparatus to have a counter electrode 21 (grounded electrode) of a certain size or larger. The plasma processing apparatus of the present invention, with the arrangement of a counter electrode 21 at the rim of microwave window 14, can suitably have a large microwave window 14, and it is particularly suitable to include the dielectric plate 32 explained in the above-described first through fifth embodiments.

The plasma processing apparatus of the present invention is suitable for such a process as etching of silicon oxide ($SiO_2$) film in which control of ion is especially crucial.

The following explains the results of experiments conducted with the plasma processing apparatus of the present invention operating at a microwave frequency of 2.45 GHz and an RF voltage frequency of 400 kHz.

Experiment 1

The plasma processing apparatus, shown in FIG. 3, was used to etch continuously 25 pieces of 6-inch wafers on which a silicon oxide film of 1 $\mu$m in thickness is formed, and the number of particles of sizes of 0.2 $\mu$m or larger was counted on the entire surface. For comparison, the same experiment was conducted with the conventional plasma processing apparatus shown in FIG. 1.

Among the etching conditions, the flow rate of $CHF_3$ was 20 sccm, the pressure was 30 mTorr, the microwave power was 1300 W, the RF voltage power was 1000 W, and the temperature of sample stage was 0° C.

According to the plasma processing apparatus of the present invention, the particle count on the wafer was less than 50, as compared with several hundreds particles resulting from the conventional apparatus.

Particles on the wafer resulting from the plasma process of the apparatus of the present invention were analyzed with the EDX (energy dispersion X-ray analyzer). Aluminum (Al) and fluorine (F) were not detected simultaneously, and the reduction of particles coming out of the counter electrode where aluminum (Al) and fluorine (F) are to be detected was confirmed.

Experiment 2

The plasma processing apparatus shown in FIG. 12 was used to assess the ability of improving the uniformity of plasma by the microwave regulation plate.

The uniformity of plasma was assessed in terms of the distribution of the rate of fluorocarbon polymer formation on a 6-inch silicon wafer resulting from the decomposition of $CHF_3$ gas by plasma.

The microwave regulation plate, shown in FIG. 14, which limits the microwave passage to a rectangular area, and the microwave regulation plate shown in FIG. 15, which adjusts the electric field distribution of the microwave, were used. For comparison, the same measurement was conducted with the apparatus having no microwave regulation plate.

Among the etching conditions, the flow rate of $CHF_3$ was 20 sccm, the pressure was 30 mTorr, the microwave power was 1300 W, and the temperature of sample stage was 0° C. No RF voltage was applied to the sample stage.

Figure 16:
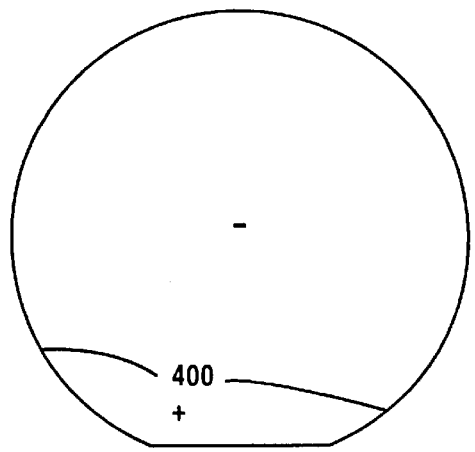
FIGS. 16, 17 and 18 are diagrams showing the distribution of the rate of fluorocarbon polymer film formation on the wafer surface.
Figure 17:
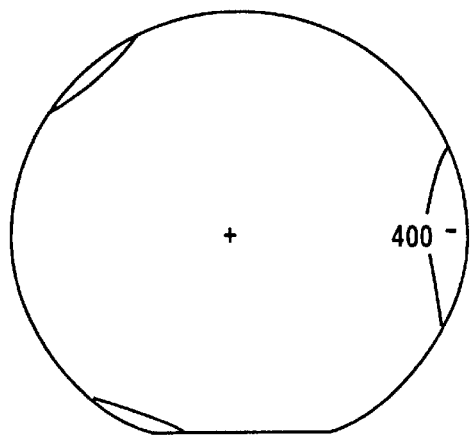
Figure 18:
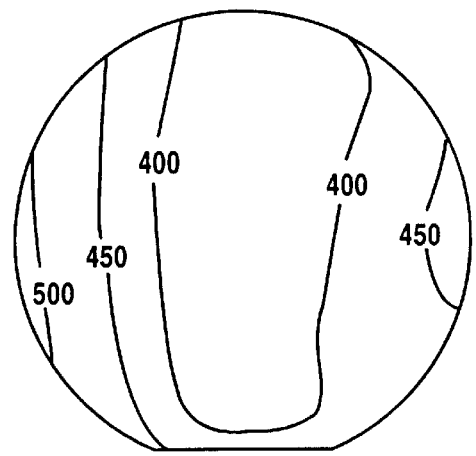

FIG. 16, FIG. 17 and FIG. 18 show the distribution of the rate of fluorocarbon polymer formation on the wafer surface. FIG. 16 is the case with the microwave regulation plate having the opening shown in FIG. 15. FIG. 17 is the case with the microwave regulation plate having the opening shown in FIG. 14. FIG. 18 is the case without a microwave regulation plate. The unit of polymer forming rate is nm/min. Symbols "+" and "−" in FIG. 16 and FIG. 17 signify that the etching rate is 400 nm/min or higher and lower than 400 nm/min, respectively.

It was confirmed that by the provision of the microwave regulation plate, the distribution of film forming rate is made uniform, and plasma of uniform density distribution can be generated.

Experiment 3

The plasma processing apparatus shown in FIG. 15 having the microwave regulation plate shown in FIG. 14 was used to generate plasma and measure the variation with time of the number of particles of sizes of 0.2 $\mu$m or larger on the entire surface of a 6-inch wafer. For comparison, the same measurement was conducted with the plasma processing apparatus having a flat microwave window 14 without the annular ridge section 14b.

Among the plasma generation conditions, gases used were $CHF_3$ and CO, the microwave power was 1300 W, and the RF voltage power was 600 W.

FIG. 19 shows a graph of the variation of particle count with respect to the plasma discharge time.

The apparatus having the microwave window without the annular ridge section 14b maintained the particle count below 50 in the first 1000 mins at most, whereas the apparatus having the microwave window with the annular ridge section 14b maintained the particle count below 50 for longer than 2500 mins.

It was confirmed that by the formation of the microwave window so as to protect the edge section of the counter electrode, the increase in the number of particles that stick to the sample with time can be suppressed further.

Industrial applicability

As described above, the plasma processing apparatus and plasma processing method of the present invention are capable of alleviating the problems of the sticking of particles to the sample and metallic contamination, and are also capable of etching a sample based on a stabilized bias voltage produced on the sample surface. Moreover, the method and apparatus of the present invention are capable of performing the uniform plasma processing for samples having large areas.

Consequently, the plasma processing apparatus and plasma processing method of the present invention, when used for the manufacturing of large-scale integrated circuits (LSIs) and liquid crystal display panels (LCDs), are capable of improving the yield thereof.

We claim:

1. A plasma processing apparatus comprising:
   means for supplying a microwave;
   a dielectric plate for propagating said microwave from said means for supplying a microwave;
   a reaction chamber having a microwave window which confronts said dielectric plate and a sample stage which confronts said microwave window;
   means for applying an RF voltage to said sample stage; and
   a counter electrode which is grounded electrically, wherein said counter electrode is located underneath a rim section of said microwave window inside said reaction chamber so that said counter electrode has no portion located above said sample stage.

2. The plasma processing apparatus according to claim 1, wherein said counter electrode has no portion located directly above said sample stage.

3. The plasma processing apparatus according to claim 1, wherein said microwave window is shaped such that an edge section of said counter electrode is protected from sputtering.

4. The plasma processing apparatus according to claim 1, further comprising a metallic microwave regulation plate having an opening for introducing said microwave into said reaction chamber, said microwave regulation plate being located on said microwave window outside said reaction chamber.

5. A plasma processing method using a plasma processing apparatus which comprising means for supplying a microwave; a dielectric plate for propagating said microwave from said means for supplying a microwave; a reaction chamber having a microwave window which confronts said dielectric plate and a sample stage which confronts said microwave window; means for applying an RF voltage to said sample stage; and a counter electrode which is grounded electrically, wherein said counter electrode is located underneath a rim section of said microwave window inside said reaction chamber so that said counter electrode has no portion located above said sample stage, comprising the steps of:

evacuating said reaction chamber in which a sample is placed on said sample stage;

supplying a processing gas into said reaction chamber;

supplying a microwave into said reaction chamber to generate a plasma through a microwave window by propagating a microwave in a dielectric plate confronted to said microwave window; and applying an RF voltage between said sample stage and said counter electrode to generate a bias voltage on the surface of said sample;

whereby said sample is processed by a plasma and is etched based on a stabilized bias voltage produced on a surface of said sample.

6. A plasma processing method according to claim 5, wherein said counter electrode has no portion located directly above said sample stage.

7. A plasma processing apparatus comprising:

a reaction chamber having a microwave window through which a microwave is introduced and a sample stage on which a sample is placed;

means for supplying a microwave;

means for supplying a microwave supplied by said means for supplying a microwave into said reaction chamber, with propagating a microwave in a direction parallel to the surface of said microwave window;

means for applying an RF voltage to said sample stage; and a counter electrode which is grounded electrically, wherein said counter electrode is located underneath a rim section of said microwave window inside said reaction chamber so that said counter electrode has no portion located above said sample stage.

8. The plasma processing apparatus according to claim 7, wherein said counter electrode has no portion located directly above said sample stage.

9. The plasma processing apparatus according to claim 7, wherein said microwave window is shaped such that an edge section of said counter electrode is protected.

10. The plasma processing apparatus according to claim 7, further comprising a metallic microwave regulation plate having an opening for introducing said microwave, said microwave regulation plate being located on said microwave window outside said reaction chamber.

11. A plasma processing method using a plasma processing apparatus which comprises a reaction chamber having a microwave window through which a microwave is introduced and a sample stage on which a sample is placed; means for supplying a microwave; means for supplying a microwave supplied by said means for supplying a microwave into said reaction chamber, with propagating a microwave in a direction parallel to the surface of said microwave window; means for applying an RF voltage to said sample stage; and a counter electrode which is grounded electrically, wherein said counter electrode is located underneath a rim reaction of said microwave window inside said reaction chamber so that said counter electrode has no portion located above said sample stage, said method comprising the steps of:

evacuating said reaction chamber in which a sample is placed on said sample stage;

supplying a processing gas into said reaction chamber;

supplying a microwave into said reaction chamber through said microwave window to generate a plasma by propagating a microwave in a direction parallel to the surface of said microwave window; and applying an RF voltage between said sample stage and said counter electrode to generate a bias voltage on the surface of said sample;

whereby said sample is processed by a plasma and is etched based on a stabilized bias voltage produced on a surface of said sample.

12. A plasma processing method according to claim 11, wherein said counter electrode has no portion located directly above said sample stage.

* * * * *